US005633113A

United States Patent [19]

Ellis

[11] Patent Number: 5,633,113

[45] Date of Patent: May 27, 1997

[54] MASS TRANSFER IMAGING MEDIA AND METHODS OF MAKING AND USING THE SAME

[75] Inventor: Ernest W. Ellis, Harvard, Mass.

[73] Assignee: Polaroid Corporation, Cambridge, Mass.

[21] Appl. No.: 421,757

[22] Filed: Apr. 14, 1995

[51] Int. Cl.$^{6}$ .............................. G03C 8/52; G03F 7/115

[52] U.S. Cl. .............................. 430/201; 430/200; 430/207; 355/73; 378/183; 378/184; 306/455; 503/227

[58] Field of Search .............................. 430/200, 201, 430/207; 355/73; 378/183, 184; 206/455; 503/227

[56] References Cited

U.S. PATENT DOCUMENTS

| | | | |
|---|---|---|---|
| 1,583,381 | 5/1926 | Zimmerman . | |
| 1,685,813 | 10/1928 | Greve . | |
| 2,002,035 | 5/1935 | Liebeskind | 206/62 |
| 2,049,497 | 8/1936 | Gideon | 250/34 |
| 2,310,371 | 2/1943 | Lines et al. | 229/85 |
| 2,689,306 | 9/1954 | Land | 378/183 |
| 2,709,223 | 5/1955 | Bachelder et al. | 378/183 |
| 2,839,317 | 2/1958 | Fairbank | 378/183 |
| 3,795,080 | 3/1974 | Smolderen et al. | 53/14 |
| 3,855,472 | 12/1974 | Removille et al. | 378/183 |
| 3,945,318 | 3/1976 | Landsman | 101/467 |
| 3,954,173 | 5/1976 | Eaton | 206/205 |
| 3,958,693 | 5/1976 | Greene | 378/184 |
| 4,108,308 | 8/1978 | Franke et al. | 206/455 |
| 4,186,308 | 1/1980 | Erikson | 378/183 |
| 4,303,160 | 12/1981 | Weindanz et al. | 206/455 |
| 4,356,224 | 10/1982 | Akao et al. | 428/220 |
| 4,359,499 | 11/1982 | Akao et al. | 428/201 |
| 4,537,306 | 8/1985 | Muylle | 206/455 |
| 4,537,307 | 8/1985 | Tamura | 206/455 |
| 4,725,865 | 2/1988 | Hoffman, Jr. | 354/276 |
| 4,784,906 | 11/1988 | Akao | 428/324 |
| 4,802,618 | 2/1989 | Seto et al. | 229/68 R |
| 4,915,229 | 4/1990 | Yamada et al. | 206/455 |
| 4,927,028 | 5/1990 | Hemm et al. | 206/618 |
| 4,955,479 | 9/1990 | Beer et al. | 206/455 |
| 5,017,547 | 5/1991 | DeBoer | 430/201 |
| 5,026,600 | 6/1991 | Akao | 428/328 |
| 5,072,830 | 12/1991 | Nielsen | 206/219 |
| 5,079,214 | 1/1992 | Long et al. | 503/227 |
| 5,123,040 | 6/1992 | Fabian | 378/182 |
| 5,123,536 | 6/1992 | DiPietro | 206/455 |
| 5,135,905 | 8/1992 | Egashira et al. | 503/227 |
| 5,156,938 | 10/1992 | Foley et al. | 430/200 |
| 5,166,967 | 11/1992 | Fabian | 378/168 |
| 5,171,650 | 12/1992 | Ellis et al. | 430/20 |
| 5,199,569 | 4/1993 | Di Pietro et al. | 206/455 |
| 5,239,805 | 8/1993 | Uchida et al. | 53/412 |
| 5,251,755 | 10/1993 | Kausch | 206/455 |
| 5,256,506 | 10/1993 | Ellis et al. | 430/20 |
| 5,257,697 | 11/1993 | Kausch | 206/455 |
| 5,268,348 | 12/1993 | Egashira et al. | 503/227 |
| 5,278,023 | 1/1994 | Bills et al. | 430/201 |
| 5,284,817 | 2/1994 | Neumann | 503/227 |
| 5,342,817 | 8/1994 | Sarraf | 430/200 |
| 5,395,681 | 3/1995 | Hargarter et al. | 428/215 |

FOREIGN PATENT DOCUMENTS

| | | |
|---|---|---|
| 577527 | 5/1991 | European Pat. Off. . |

*Primary Examiner*—Richard L. Schilling
*Attorney, Agent, or Firm*—Leslie Payne

[57] ABSTRACT

An image media assembly comprising: a donor element, a receptor element, and means for maintaining at least the elements in a predetermined position wherein one element overlies the element, said means including a vacuum present between the elements.

19 Claims, 2 Drawing Sheets

MASS TRANSFER IMAGING MEDIA AND METHODS OF MAKING AND USING THE SAME

BACKGROUND OF THE INVENTION

The present invention relates generally to imaging assemblies which include donor and receptor elements, such as used in the printing field, more particularly, to laser addressable mass transfer imaging assemblies, as well as methods of making and using the same.

In the printing field, a variety of imaging assemblies have been used for forming positive and negative images on various substrates, such as print, proofs, printing plates, films or masks. One known category of imaging assemblies is a thermal mass transfer type. Thermal mass transfer imaging includes, for instance, dye diffusion thermal transfer, wax melt, and laser ablation transfer. Generally with mass transfer imaging approaches, heat is selectively applied in an imagewise manner to a donor element of a composite donor and receptor imaging assembly for effecting transfer of preselected portions of a donor material, such as a polymer or a colorant, onto a coextensive receptor element or substrate. U.S. Pat. No. 5,256,506 describes a very successful imaging media which, in response to laser activation, effects a laser-ablation type transfer of pixels of donor material to the receptor.

In imaging these known types of mass transfer imaging media, it has been the usual practice for the donor and receptor elements to be handled separately and then joined and held together during imaging before their subsequent separation. The typical donor and receptor elements are thin and fragile and, therefore, must be handled with great care to avoid damage, such as abrasion and scratching during handling and transfer. For imaging this kind of media, the donor and receptor elements are held in uniform contact by a vacuum lamination procedure which involves holding both the donor and receptor elements together by vacuum. For instance, in laser addressable mass transfer imaging systems, such as described in U.S. Pat. Nos. 5,171,650 and 5,156,938, a receptor element is mounted on internal or external drum's of laser recorders followed by the physical overlaying an oversized donor element over the receptor element. The donor and receptor elements are usually held together by vacuum drawn through features on the drum. This process is, however, subject to certain drawbacks in terms of the possibility of dust and paper debris becoming trapped between the juxtaposed elements. The inclusion of such debris sometimes gives rise to image artifacts or defects during subsequent laser imaging. Moreover, because vacuum is applied to the sheets, there is an enhanced probability of small air bubbles becoming entrained between their interface with the consequence of non-uniform gaps being formed. The presence of such bubbles also leads to the formation of undesirable imaging artifacts.

Heretofore, several solutions have been proposed for overcoming these drawbacks and these have included rather elaborate and costly mechanical approaches, such as media web precleaning, positive air pressure in the write engine, and squeegee devices which are used to force the air from the interface of the donor and receptor elements.

Accordingly, there is a continuing desire to improve upon approaches for handling a mass transfer imaging assembly in manner which maintains its integrity, facilitates ease of handling, as well as continued usage with known imaging devices, and, importantly, allows imaging to be performed in a manner whereby the resulting images are free of undesirable image artifacts.

SUMMARY OF THE PREFERRED FORMS OF THE INVENTION

An object of the present invention is to provide novel and improved imaging assemblies as well as methods of making and using the same. In one preferred form of the invention, there is provided an improved image media assembly comprising: a donor element, a receptor element, and means for maintaining at least the elements in a predetermined position wherein one element overlies the other element, said means including a vacuum present between the elements.

In another preferred form of the invention, the imaging assembly is a laser addressable mass transfer imaging material. Still another form of the invention includes having the elements held together in substantially uniform and intimate contact.

In still another preferred form of the invention, the maintaining means includes an air-tight enclosure for enclosing at least a portion of one element to the other element. While in still another form, the air-tight enclosure encloses both of the elements.

In yet another preferred form of the invention, the air-tight enclosure is made of material transmissive to imaging energy. Still further, this embodiment can include an enclosure which is substantially dust and debris free. In such an embodiment, the maintaining means includes a seal between the elements to maintain the vacuum. One embodiment of the seal includes an adhesive material.

In yet another preferred form of the invention, the donor element is a mass transfer imaging laser-ablatable medium comprising a substrate, an intermediate laser-ablative material, and an imaging radiation-ablative carrier topcoat.

In still another preferred form of the invention the enclosure is a flexible envelope and the assembled donor and receptor elements are flexible so as to be closely conformable to objects which they will be mounted on. In such an embodiment, the enclosure includes a peelable portion which is peelable to allow removal of the imaged donor and receptor elements.

In one preferred form of the invention, there is provided a method of imaging including the steps of: assembling image media including a donor element and a receptor element with one element overlying the other element in a package material, and imaging the elements through the image packaging material.

In one preferred form of the invention, there is provided a method of imaging including the steps of: assembling image media including a laser-ablatable donor element and a receptor element with one element overlying the other element in a package material, and imaging the elements through the image packaging material.

In one preferred form of the invention, the method includes the step of applying a vacuum between the sheets in the package to maintain the sheets in a predetermined position relative to each other, and imaging the sheets held by the vacuum.

In still another preferred form of the invention, there is a method of holding a mass transfer image donor element in overlying relationship with a receptor element comprising the steps of: assembling a laser mass transfer imaging element in overlying relationship with a receptor element; applying a vacuum between the elements such that the vacuum assists in holding the elements together in a predetermined relationship; and sealing the elements together.

In one preferred form of the invention, there is provided a method of holding a laser mass transfer image donor element in overlying relationship with a receptor element comprising the steps of: assembling a laser mass transfer imaging element in overlying relationship with a receptor element; enclosing the assembled elements in an enclosure which is transmissive to imaging radiation; applying a vacuum to the enclosure so that the vacuum maintains the elements together in a predetermined relationship; and sealing the enclosure.

In still another preferred form of the invention, provision is made for a method of imaging a mass transfer imaging assembly comprising the steps of: providing a mass transfer imaging assembly including at least a donor sheet and a receptor sheet in overlying relationship between mass transfer imaging sheet, and an enclosure which encloses at least a portion of the sheet; wherein the enclosure has a portion thereof made of material transmissive to energy for initiating imaging of the sheet; placing the imaging assembly in a position for it to be imaged; and, directing mass transfer imaging energy in an imagewise manner to the enclosure portion so as to initiate mass transfer imaging of the sheet. In yet another preferred form of the invention, the enclosure is openable for allowing removal of the imaged sheet.

In still another preferred form of the invention, provision is made for a method of mass transfer imaging a mass transfer imaging assembly comprising the steps of: providing a mass transfer imaging assembly including at least a pair of juxtaposed mass transfer imaging sheets wherein one of the sheets includes a laser-ablatable layer, and an enclosure which encloses at least a portion of one of sheets and a portion of the other sheet; wherein the enclosure has a portion thereof made of material transmissive to energy for initiating imaging of at least the juxtaposed sheets; placing the imaging assembly in a position for it to be imaged; directing mass transfer imaging energy in an imagewise manner to the enclosure portion so as to initiate imaging of the assembly thereof. In another preferred form of the invention, the enclosure is openable so that imaged assembly can be removed after imagewise exposure.

Among the objects of the invention are, therefore, the provision of an improved mass transfer imaging assembly as well as methods of making and using the same; an integral mass transfer imaging assembly of the above type in which a donor and receptor composite can be held together in uniform engagement prior to and during exposure to obtain high quality images; a mass transfer imaging assembly of the above type which is laser addressable; a mass transfer imaging assembly of the above type in which the donor and receptor composite is held together in a debris free condition; a mass transfer imaging assembly as noted above which is easily conformable to existing laser imaging devices; a mass transfer imaging assembly of the above type which is protected against scratching, abrasion or other damage in shipping, storage, and use; a mass transfer imaging assembly in which the donor and receptor composite is easily removed.

DETAILED DESCRIPTION

Figure 1:
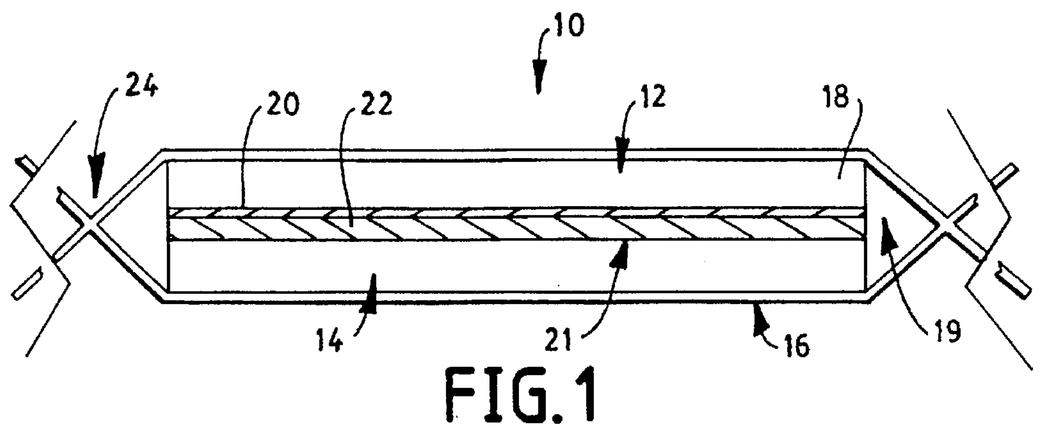
FIG. 1 is a diagrammatic cross-sectional view of one preferred embodiment of a composite mass transfer medium made according to the present invention.

Initial reference is made to FIG. 1, for illustrating one preferred embodiment of a unitized and self-contained mass transfer imaging assembly 10. In this embodiment, the mass transfer imaging assembly 10 includes a thin, sheet-like donor element 12, an overlying thin, sheet-like receptor element 14, and an enclosure 16 which encompasses both of the sheets. In this embodiment, the donor element can be a laser addressable kind like that described in U.S. Pat. No. 5,256,506. Accordingly, a description of the donor element as described in the latter patent is incorporated herein by reference. By the term donor element as used in the specification and claims, it is intended that it embrace any type of mass transfer medium which includes, but is not limited to, a medium that is heated by lasers, thermal printing heads, electrostatics or other some other mechanism. Of course, the receptor element can be a suitable type such as described in the last noted patent. Basically, the ablation-transfer donor element or medium includes a support substrate 18, at least one intermediate dynamic release layer 20 generally coextensive therewith, and at least one imaging radiation-ablative carrier topcoat 22 also generally coextensive therewith. In addition, the receptor element 14 is shown in generally contiguous registration with the donor element 12. For imaging the donor element 12, the latter is subject to a pattern of imaging radiation at the desired wavelengths. This imaging energy causes ablation of preselected portions of the carrier topcoat and is transferred to the receptor element. As a consequence, there is produced an imaged donor film and a corresponding image of opposite sign on the receptor element. The imaging radiation employed for this type of laser addressable mass transfer imaging media can include wavelengths in the visible and near infrared spectral regions. Further in this regard there is provided, a variety of imaging radiation devices for imagewise exposing, such as solid state lasers, semiconductor diode lasers, gas lasers, dye lasers, xenon lamps, mercury arc lamps, as well as other sources of energy. Of course, the present invention is not limited to the means by which the media is imaged. Thus, other types of sources for such energy can be employed if they are capable of providing the necessary energy levels necessary for effecting the ablative transfer process for the particular medium involved. Although a variety of sources have been disclosed for energizing the donor element, the ablation-transfer process is most easily accomplished by means of laser energy, such as described in the last noted patent or U.S. Pat. Nos. 5,156,938; and, 5,171,650 which is particularly suited. The disclosures of the last two patents are incorporated herein by reference. As far as the laser is concerned, it will be appreciated that the specific wavelengths and power sources as well as time durations thereof are functions of among other factors, the donor element materials selected. Therefore, this invention encompasses an entire range of sources and energy levels as are necessary to achieve the laser-ablation transfer. The present invention envisions that the composite donor and receptor elements can have a wide variety of sizes and shapes and the elements need not be coextensive with each other. Of course, the thickness' of the donor and receptor elements are suitably formed so that the imaging assembly 10*b* will be able to withstand the normal handling expected in a printing environment.

The enclosure 16 is, preferably, a thin and flexible plastic bag or envelope which has the characteristics capable of forming an air-tight package. As will be described in more detail to follow, when vacuum is drawn within the enclosure, it allows the ambient pressure to force the donor and receptor elements together at their common interface 21 into a laminate composite wherein, preferably, there is an uniform and intimate contact between the two. It is known that more uniform and intimate engagement between the donor and receptor elements, the higher quality resolution images are formed. While this embodiment discloses the uniform and intimate contact between the donor and receptor elements, it will be appreciated that there be only an uniform engagement or that there exist a gap between the facing surfaces of the overlying elements. This gap can be in the form of an extremely small spacing between abutting elements 12 and 14, such as on the order of several microns 0.01–20 μm. Accordingly, the donor and receptor elements 12 and 14 can also be in overlying relationship with each other and not in intimate contact. In this embodiment, the enclosure 16 is a clear polyester material which is transmissive to the laser wavelengths that are effective to achieve the laser-ablation transfer. The polyester material besides being transmissive to the imaging radiation is also substantially impervious to passage of air for maintaining the vacuum conditions. As noted above, if air is contained between the donor and receptor elements it can lead to the formation of bubbles and non-uniform gaps and the like and thus, image artifacts. While this embodiment illustrates that the entire enclosure is a transparent polyester, it will be appreciated that the present invention envisions having only selected portions or windows which are transparent to the imaging energy. Whatever, material is selected, however, it should, preferably, maintain the air-tightness of the cavity 19 formed by the enclosure 16. Another advantage of using polyester is the fact that it has appropriate abrasion and moisture resistance characteristics. Accordingly, the enclosure 16 can protect the integrity of the donor and receptor elements. Because the enclosure 16 is air-tight and wrapped about the laminate, there is formed an integral or unitized assembly which is easily handled by an operator and/or machine for imaging as well as storage and transportation purposes. Moreover, because the enclosure and the donor and receptor composite are flexible they can, therefore, easily conform to a mounting surface, such as external and internal drums as well as flatbed type vacuum frame members.

Other suitable materials from which the enclosure can be made include, without limitation, plastic sheets and films, such as those made of polyethyleneteraphthalate, fluorine polyester polymer consisting essentially of repeating interpolymerized units derived from 9,9-bis(4-hydroxyphenyl) fluorene and isophalic acid, terephthalic acid or mixtures thereof, and hydrolyzed and unhydrolyzed cellulose acetate.

To form the imaging assembly as depicted in FIG. 1, there is provided an empty polyester enclosure or pouch 16 having an open end portion (not shown) for receiving the donor and receptor elements 12 and 14. After the enclosure is loaded with the donor and receptor elements, a vacuum is drawn on both sides thereof in a vacuum chamber for evacuating the enclosure. A flap portion, also not shown, of the enclosure is folded to close the open end and the polyester enclosure is sealed, such as by heat sealing at 24 for maintaining the enclosure 16 in an air-tight manner. Besides heat sealing the enclosure, adhesives, heat activatable and pressure types may be used to facilitate the sealing edges. The foregoing approach of forming an air-tight enclosure is but one of several which could act to force the donor and receptor elements into contact with each other. Accordingly, there is formed an imaging assembly which is unitized and can be shipped, handled and imaged before ever having to be opened until it is desired to do so. Since the enclosure is transparent in nature, it is possible to view the image without having to remove it. If desired the donor/receptor combination can be removed prior to imaging.

For removing the donor/receptor combination, the enclosure 16 can be opened in a wide variety of ways including, but not limited to cutting, tearing, or some mechanism as tear strips and other suitable approaches for opening a bag. Once the enclosure is opened the donor and receptor elements can be easily removed and separated since the two were held together by vacuum compression. Thereafter, the substrate can be subsequently processed such as by post-curing.

EXAMPLE 1

This example illustrates a process of the present invention in which a printing plate is formed.

LAT Computer-to-Plate

Figure 5:
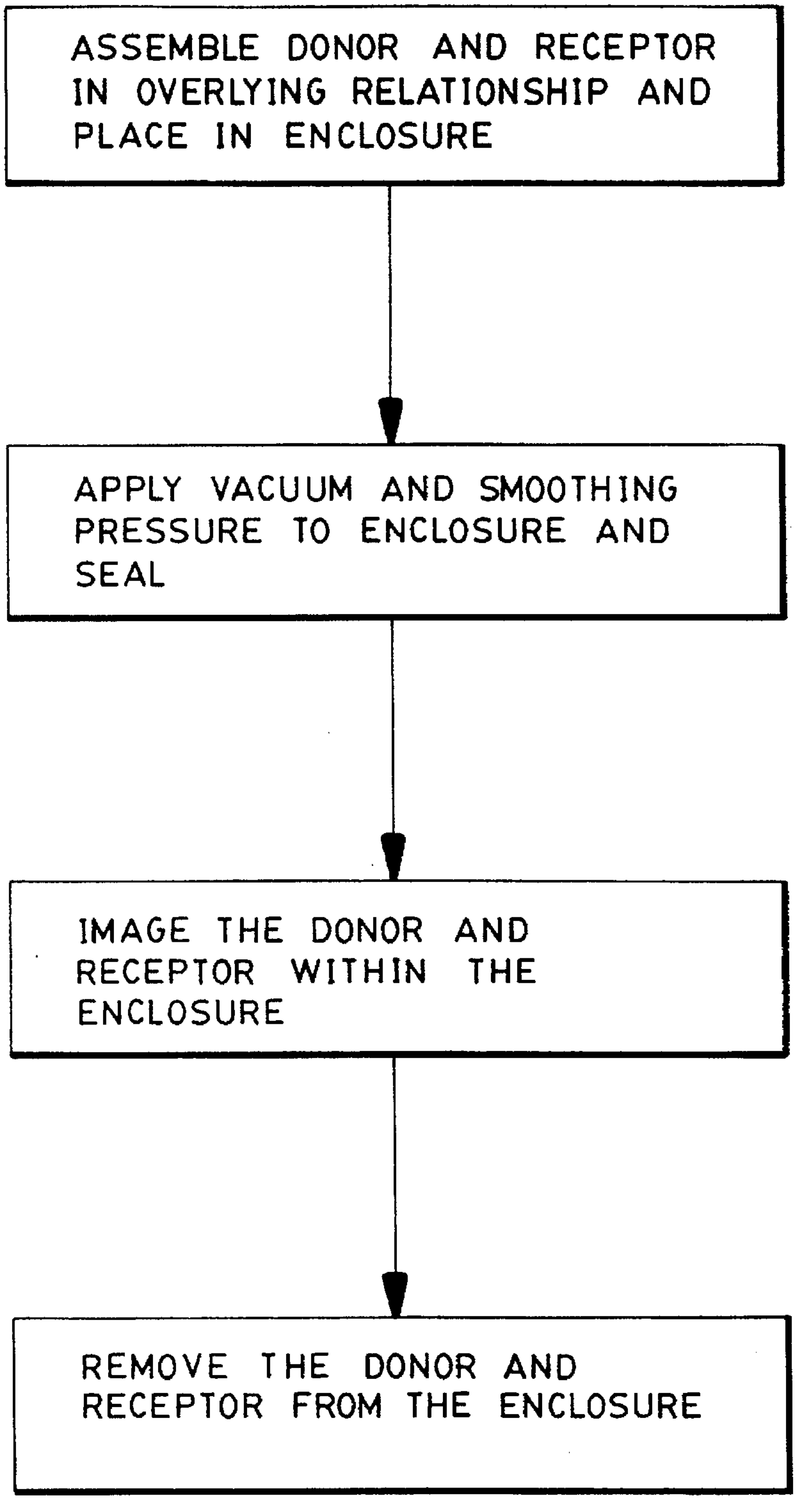

A substrate element having a grained anodized side of an aluminum plate (13"×16"×8" mils) was mated with the coated side of a LAT (laser-ablation transfer) donor element consisting of an aluminized polyester sheet overcoated with an ablatable ink receptive polymeric material (13"×16"×3 mils). As used throughout the specification the abbreviation LAT means laser-ablation transfer. This donor/receptor composite or combination was then placed in a clear polyester bag (~18"×18"×~1 mil thick) while being contained in a vacuum chamber. The vacuum chamber was evacuated to about 26 in. Hg. and the bag heat sealed as by using commercial vacuum packaging equipment so that the heat seal maintains the vacuum. Foam-like pressure pads were used to apply a smoothing pressure to force flatness of the enclosure. The enclosure was then removed from the chamber, placed in an internal dram write engine, it being understood that the imaging assembly was made to closely conform to the drum surface by means of tension. Thereafter, the imaging assembly 10 was laser imaged in a manner consistent with the teachings relating to effecting laser-ablation transfer. The imaged donor/receptor laminate was then removed from the vacuum packing or enclosure 16, whereby the donor element yielded a lithographic printing plate and a corresponding negative mask. Reference is made to FIG. 5 for illustrating the steps involved with this embodiment.

EXAMPLE 2

The example to follow illustrates a process of forming a momochrome proof using laser-ablatable materials.

A sheet of grade #1 paper printing stock (13"×16") was mated with the coated side of a LAT donor element consisting of an aluminized polyester sheet overcoated with an ablatable cyan ink formulation (13"×16"). The donor/receptor combination was then placed in a clear polyester bag (~18"×18"×~1 mil thick) all contained in a vacuum chamber. The chamber was evacuated to about 26 in. Hg. and the bag heat sealed to maintain the vacuum. The package was then removed from the chamber, and placed in an internal drum write engine( the media package made to conform to the drum surface by vacuum) and laser imaged using the appropriate laser and power described in the last noted patent. The resulting donor/receptor laminate was removed from the vacuum packaging and the donor element removed from the package so as to form a cyan positive proof and a corresponding negative cyan mask or negative. The removal step was accomplished by opening the flap and simply emptying the contents of the package. Once the donor/receptor combination was removed, the two were easily separated from each other since the vacuum conditions no longer exist.

It will be appreciated that the present invention envisions a plurality of known approaches for forming an evacuated enclosure 16. For example, the donor/receptor composite can be sandwiched between a pair of juxtaposed polyester sheets of the above noted type and then a vacuum is formed. Thereafter, the two sheets are appropriately sealed, such as by heat sealing to form an air-tight enclosure. It should be noted that the manner of forming an air-tight enclosure does not, per se, form a part of the present invention. In addition, the present invention contemplates forming the imaging assembly in a clean room so that the enclosure is free of dust and debris and therefore, the interface between the donor and receptor elements. Accordingly, there is formed an environmentally protected imaging assembly 10. While the above embodiments describe the use of a single ply polyester bag, it will be appreciated that multi-ply arrangements can be utilized. Polyester can also provide desired moisture resistance and durability characteristics.

While the present invention illustrates a single composite of donor and receptor imaging elements within the enclosure, it is within the spirit and scope of this invention to have a plurality of such composite groupings if desired. For instance, there can be a double-sided composite arrangement of donor and receptor elements within in the enclosure 16, wherein each composite is imageable. Alternately, the single enclosure can be linked to others so as to form a web-like chain of enclosures. Moreover, at least a portion of the enclosure 16 is transmissive to the laser wavelengths necessary for laser writing as will be described hereinafter.

Figure 2:
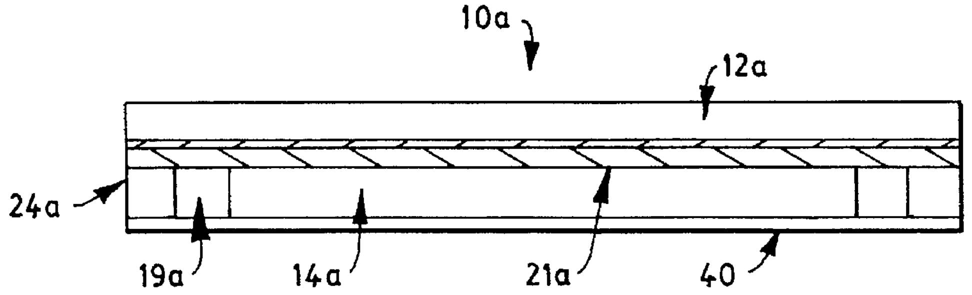
FIG. 2 is a diagrammatic cross-sectional view of another preferred form of a composite donor and receptor mass transfer medium.

Reference is now made to FIG. 2, for purposes of illustrating another preferred form of the present invention. In this embodiment, the donor element **12*a* is oversized relative to the receptor element 14*a* and has its marginal edges sealed, such as by heat sealing 24*a* to a backing substrate 40 upon which the receptor element rests. Accordingly, the receptor element is sandwiched between the backing substrate and the donor element whereby the donor element forms an integral part of the enclosure itself. In this embodiment, the donor element 12*a* and the substrate element 14*a* are made of the same kinds of materials as the donor element of the previous embodiment. The backing substrate 40 can be made of the same kinds of material as the enclosure 16 of the last embodiment. For instance, the substrate 40 can be made of a thin and clear polyester material. For assembling this imaging embodiment, the backing substrate 40 is positioned in a vacuum chamber and the receptor element 14*a* is placed thereon. Thereafter, the oversized donor element 12*a* is positioned in overlying relationship to the receptor 14*a* and the backing substrate 40 as illustrated. The marginal edges of the donor sheet are sealed to the backing substrate, such as by heat sealing at 24*a* to form a unitized imaging assembly 10*a***. Accordingly, the donor and receptor elements are maintained together by the vacuum existing therebetween and in the enclosure. As with the previous embodiment, the resulting imaging assembly can be shipped, handled, and imaged. If desired the donor/receptor combination can be further processed in the enclosure if it is desired.

Figure 3:
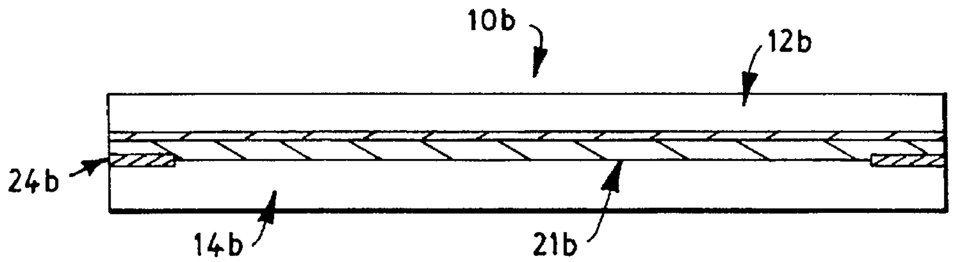
FIG. 3 is a diagrammatic cross-sectional view of still another preferred form of a donor and receptor mass transfer medium.

Reference is now made to FIG. 3 for illustrating another preferred embodiment of the present invention. In this embodiment, the donor and receptor elements **12*b* and 14*b* form an integral imaging assembly 10*b*, but without a separate enclosure. The donor and receptor elements can be made of the same materials noted in the above preferred forms of the invention. As earlier noted, the thicknesses of the donor and receptor elements 12*b* and 14*b* are suitably formed so that the imaging assembly 10*b* will be able to withstand the normal shipping and handling expected in a printing environment. One approach for joining the two into an integral unit wherein the vacuum is maintained between the donor and receptor elements is to assemble both in a vacuum chamber, wherein they are placed in overlying face-to-face relationship with each other. After a vacuum is applied, any air existing at the interface 21*b* between the donor and receptor elements will have been evacuated and the marginal edges can be sealed at 24*c*** to maintain the vacuum existing between the donor and receptor elements, by a suitable means, such as an adhesive layer on one or both of the mating surfaces being brought into contact with each other, as by the application of a pressure device. This invention contemplates that a variety of adhesive materials can be used. For instance, such adhesives can be of the heat activatable and pressure types. One preferred type of adhesive that is contemplated for use is a hot melt urethane. Such an adhesive is particularly advantageous since it possesses the characteristics of retention of the vacuum of prolonged periods and can be rather easily removed. One preferred sealing method requires no adhesive. The enclosure melts together to form a seal. Following imaging the donor element as described above, the donor/receptor elements can be separated, such as by breaking the adhesive bonding therebetween.

Accordingly, there is produced an imaging medium which can be directly and easily handled by an operator and can be placed into known imaging assemblies without extra steps being made to accommodate the medium. This embodiment like the last can be subject to the vacuum and the sealing in a clean room environment so that the interface between the two elements is substantially dust and debris free. As a result an environmentally sound imaging assembly or medium is formed.

Figure 4:
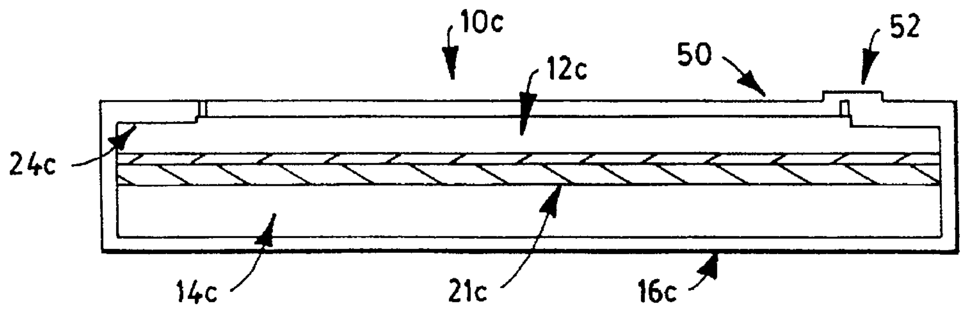
FIG. 4 is a diagrammatic cross-sectional view of still another preferred form of a donor and receptor mass transfer medium; and, FIG. 5 is a flow diagram of one preferred method of the present invention.

Reference is made to FIG. 4 for illustrating yet another preferred form of this invention. Basically, this imaging assembly **10*c* is like that described above in connection with FIG. 1, with, however, the addition of the enclosure 16*c* being formed with a peelable or tearable flap portion 50 which preferably defines an imaging window for the media. Not only is the construction of this embodiment similar to the first described embodiment, but so is the method of assembly. The main difference is in the manner of forming the flap portion and of securing it to the enclosure 16*c*. It will be understood that in this embodiment, the perimeter of the flap is sealed as at 24*c* to the enclosure through the use of heat sealing or adhesives. The flap portion 50 is opaque or transparent to the laser energy contemplated to achieve the laser-ablation. It is intended that the flap portion 50 can be peeled or torn out before imaging. In this regard, the flap portion 50 has a pull tab 52**. While it is possible to write through the flap portion, that function is not a requirement of the invention. Of course, the entire donor/receptor combination can be removed after appropriately opening the enclosure.

Although the embodiments described above use discrete sheets of material, it will be appreciated that the principles of the present invention can be applied to continuous webs of material without departing from the scope of this invention.

Moreover, the present invention envisions an embodiment wherein instead of laser imaging being the preferred manner of writing, the air-tight enclosure can be directly impacted with a thermal print head (not shown). In so doing the heat will pass through the enclosure and the donor element so as to effect the mass transfer of the donor thermal mass transfer imaging material to a receptor. In such an embodiment, for example, the air-tight enclosure could be made of a metallic foil or polyethyleneteraphthalate film which is thin so as to transfer heat in an efficient path between the print head and the underlying thermal mass transfer donor element without the area of heat being spreading undesirably in the enclosure so as to diminish the resolution of the resulting transferred image. Printing of the last noted type can be particularly useful for producing relatively low resolution images.

The present invention may be embodied in other specific forms without departing from the spirit or essential characteristics thereof. The present embodiments are, therefore, to be considered in all respects as illustrative and not restrictive. The scope of the invention being indicated by the appended claims rather than by the foregoing description and all changes which come within the meaning and the range of equilvalency of the claims are therefore intended to be embraced therein.

What is claimed is:

1. An image media assembly comprising: a donor element, a receptor element, and means for maintaining at least the elements in a predetermined position wherein one element overlies the other element, said means including a vacuum present between the elements, further wherein said means includes a seal between said elements to maintain the vacuum.

2. The imaging assembly defined in claim 1 wherein said donor element is a laser mass transfer imaging material.

3. The imaging assembly defined in claim 2 wherein said means includes an air-tight enclosure for enclosing at least a portion of one element to the other element.

4. The imaging assembly defined in claim 2 wherein said means includes an air-tight enclosure for enclosing both of said elements.

5. The imaging assembly defined in claim 4 wherein said air-tight enclosure is substantially dust and debris free.

6. The imaging assembly defined in claim 1 wherein said elements are in contact with each other.

7. The imaging assembly defined in claim 1 wherein said seal is formed by at least an adhesive material.

8. The imaging assembly defined in claim 2 wherein said mass transfer imaging material comprises a laser-ablatable donor element which includes a substrate, an intermediate laser-ablative material, and an imaging radiation-ablative carrier topcoat.

9. The imaging assembly defined in claim 2 wherein said laser mass transfer imaging material comprises a laser-ablatable donor element which includes a substrate, and an imaging radiation-ablative carrier topcoat.

10. The imaging assembly defined in claim 9 wherein said carrier topcoat includes one or more pigments and/or polymers.

11. An image media assembly comprising: a donor element, a receptor element, and means for maintaining at least the elements in a predetermined position wherein one element overlies the other element, said means includes an air-tight enclosure for enclosing both of said elements, wherein said enclosure is a flexible envelope and said assembled elements are flexible so as to be closely conformable to objects which they will be mounted on.

12. The imaging assembly defined in claim 11 wherein said flexible enclosure is openable so as to allow removal of said elements.

13. A method of holding a mass transfer image donor element in overlying relationship with a receptor element comprising the steps of: assembling a laser mass transfer imaging element in overlying relationship with a receptor element; applying a vacuum between the elements such that the vacuum assists in holding the elements together in a predetermined relationship; and sealing the elements together so as to maintain the vacuum between the elements.

14. A method of holding a laser mass transfer image donor element in overlying relationship with a receptor element comprising the steps of: assembling a laser mass transfer imaging element in overlying relationship with a receptor element; enclosing the assembled elements in an enclosure which is transmissive to imaging radiation; applying a vacuum to the enclosure so that the vacuum maintains the elements together in a predetermined relationship; and sealing the enclosure so as to maintain the vacuum between the elements.

15. The method of claim 14 wherein the step of applying vacuum is performed in a dust and debris free ambient environment.

16. The method of claim 14 wherein the step of applying vacuum is responsible to bring the elements in uniform contact.

17. The method as defined in claim 14 wherein the enclosure is a flexible envelope and the assembled elements are flexible so as to closely conformable to objects which they will be mounted on.

18. The method of claim 16 wherein the step of applying vacuum includes applying pressure to the enclosure to force flatness thereof.

19. An image media assembly comprising: a donor element, a receptor element, and means for maintaining at least the elements in a predetermined position wherein one element overlies the other element, said means including a vacuum present between the elements, said means includes an air-tight enclosure for enclosing at least a portion of one element to the other element, wherein said air-tight enclosure is made of material transmissive to imaging energy.

* * * * *